(12) United States Patent
Braun

(10) Patent No.: US 6,807,092 B1
(45) Date of Patent: Oct. 19, 2004

(54) MRAM CELL HAVING FRUSTRATED MAGNETIC RESERVOIRS

(75) Inventor: Daniel Braun, Ossining, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/461,029

(22) Filed: Jun. 13, 2003

(51) Int. Cl.[7] .............................................. G11C 11/15
(52) U.S. Cl. ........................ 365/173; 365/158; 365/213
(58) Field of Search ................................ 365/173, 158, 365/213

(56) References Cited

U.S. PATENT DOCUMENTS 6,653,703 B2 * 11/2003 Hosotani et al. ............ 257/421
6,704,220 B2 * 3/2004 Leuschner ................... 365/173
6,744,651 B2 * 6/2004 Tang ............................ 365/33

* cited by examiner

Primary Examiner—Van Thu Nguyen
Assistant Examiner—Toan Le
(74) Attorney, Agent, or Firm—Moser, Patterson & Sheridan, L.L.P.

(57) ABSTRACT

A magnetoresistive random access memory (MRAM) cell, comprising a magnetic tunnel junction having frustrated magnetic reservoirs disposed oppositely along two edges of a free magnetic layer of the junction and magnetized in the same direction that is substantially orthogonal to a free magnetic layer.

34 Claims, 2 Drawing Sheets

MRAM CELL HAVING FRUSTRATED MAGNETIC RESERVOIRS

BACKGROUND OF THE INVENTION

1. Field of the Invention

The present invention generally relates to memory devices. More specifically, the present invention relates to magnetoresistive random access memory (MRAM) devices.

2. Description of the Related Art

In a magneto-resistive random access memory (MRAM) device, a plurality of the memory cells (i.e., MRAM cells) is typically arranged in a cross-point array, wherein the MRAM cell is sandwiched at the intersection of a bit line and a word line. The bit lines and word lines are conductive lines facilitating selection of a given MRAM cell and read and write operations.

A MRAM cell generally comprises a magnetic structure known as a "magnetic tunnel junction" (MTJ). In the MRAM cell, information is stored in a form of a direction of magnetization in a magnetic layer of the MTJ. Such stored information may be preserved for long periods of time without use of sources of energy.

The MTJ generally comprises two magnetic layers of different coercivity that are separated by an insulating non-magnetic tunnel layer. The tunneling current depends on relative orientation of magnetization in these magnetic layers. In the MTJ, a memory state is characterized by the direction of magnetization of the magnetic layer having a lower coercivity than the other magnetic layer of the MTJ. The low coercivity layer is known as a "free magnetic layer". To increase stability of the memory state, the free magnetic layer is generally elongated in the direction of magnetization.

Writing an information content (i.e., "0" or "1") in the MRAM cell is accomplished by causing a magnetic material of the free magnetic layer to be magnetized in either one of two opposing directions, while the other layer permanently maintains its state of magnetization. Reading the information content of the MRAM cell is accomplished by sensing electrical resistance, which differs whether the magnetic layers of the MTJ are magnetized in the same or opposing directions. Magnetic fields used for programming the MRAM cell are created by passing currents through the bit and word lines ("write" operation) or through the lines and the MTJ ("read" operation). The write current of the MRAM cell is generally inversely proportional to anisotropy of a form factor of the free magnetic layer.

A value of the write current and stability of the information content (i.e., stability of the states of magnetization of the free magnetic layer) of the MRAM cell are among the most important characteristics of the MRAM device.

In the MRAM cell, the write current generally tends to increase as dimensions of the MRAM cell decrease. High-current electrical circuits occupy large areas of a MRAM chip and, as such, a high write current becomes a limitation for fabricating high-density MRAM devices. Additionally, the MRAM cell where a memory state depends on anisotropy of the form factor of the free magnetic layer has a narrow operational temperature range.

Therefore, there is a need in the art for an improved magnetoresistive random access memory (MRAM) cell having a low write current and a broad operational temperature range.

SUMMARY OF THE INVENTION

A magnetoresistive random access memory (MRAM) cell comprises a magnetic tunnel junction (MTJ) having frustrated (i.e., magnetized) magnetic reservoirs that are disposed oppositely along two edges of a free magnetic layer of the MTJ. The magnetic reservoirs are magnetized in the same direction and substantially orthogonally to the free magnetic layer of the MTJ. In one embodiment, the free magnetic layer comprises a centrally located region having a width that is smaller than the width of any other region of the layer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a magnetoresistive random access memory (MRAM) cell comprising a magnetic tunnel junction (MTJ) having frustrated (i.e., magnetized) magnetic reservoirs that are disposed oppositely along two edges of a free magnetic layer of the MTJ. Such MRAM cell may be formed on a substrate (e.g., semiconductor substrate) and used as a storage element for an information content of a MRAM device having a low write current and a broad operational temperature range.

Figure 1:
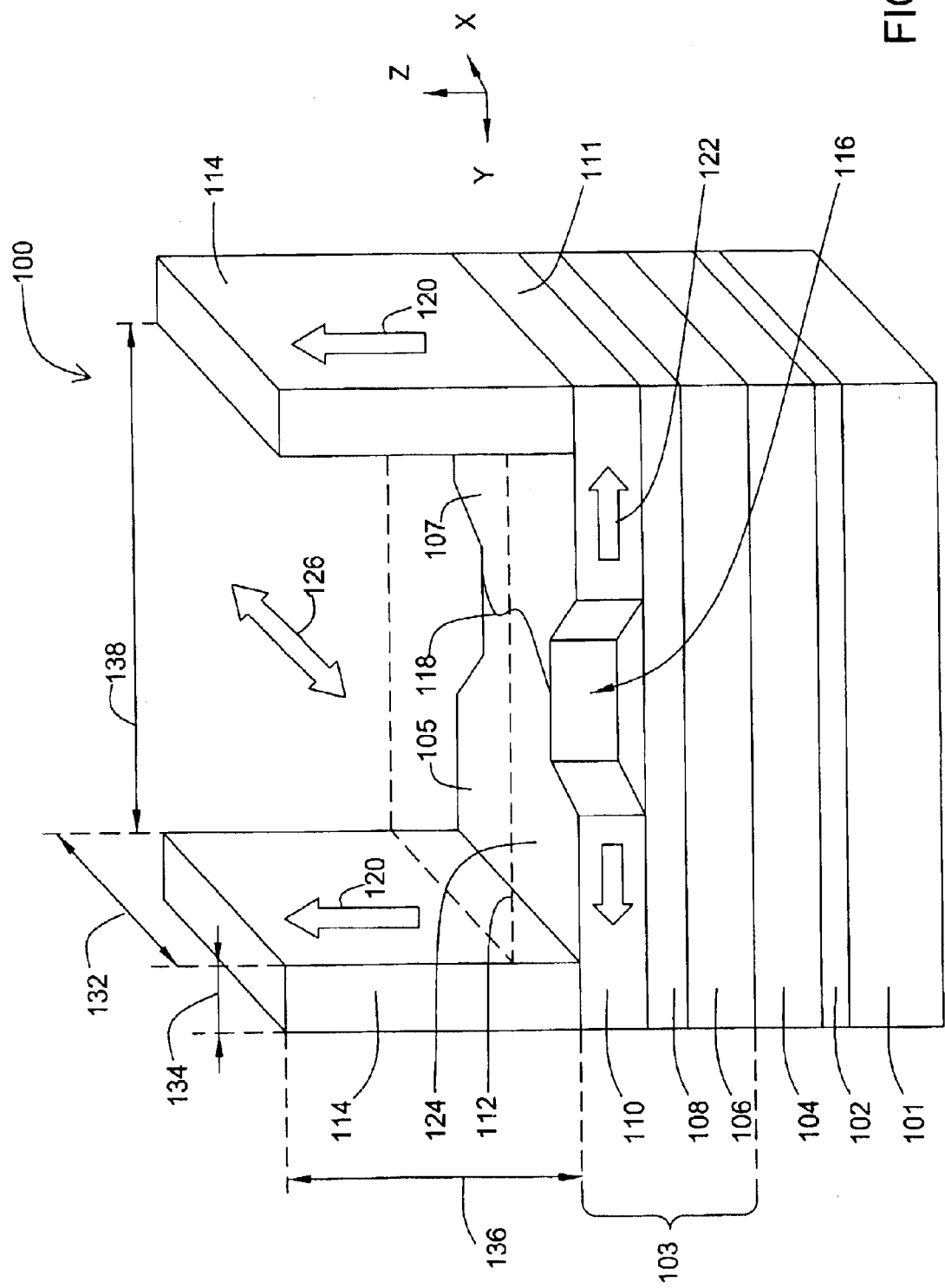
FIG. 1 depicts a schematic perspective view of a MRAM cell having frustrated magnetic reservoirs in accordance with one embodiment of the present invention.
Figure 2A:
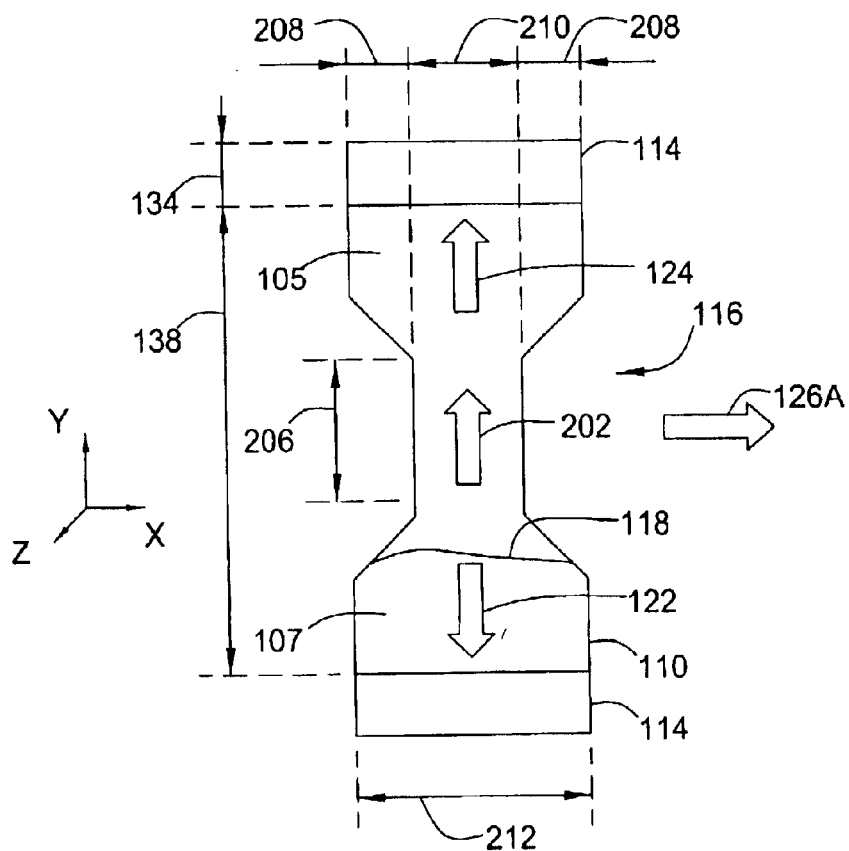
FIGS. 2A–2B depict exemplary representations of the states of magnetization of the free magnetic layer of the MRAM cell of FIG. 1.
Figure 2B:
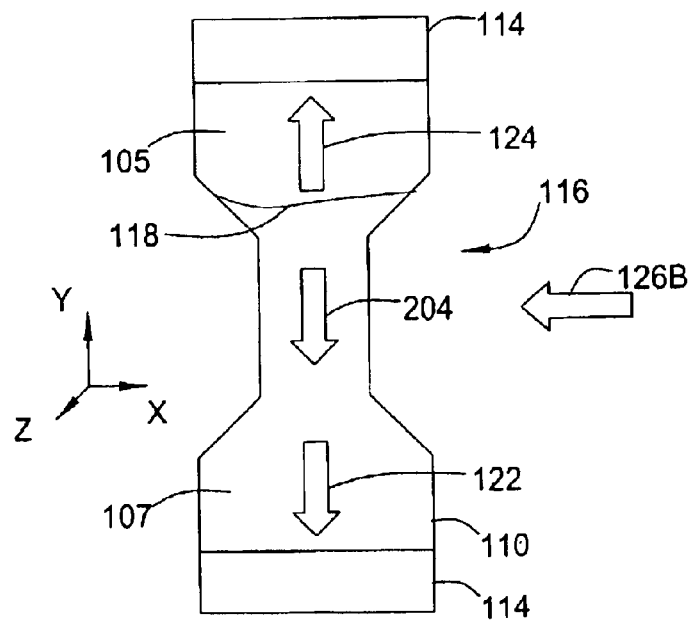

FIG. 1 depicts a schematic perspective view of a MRAM cell 100 having frustrated magnetic reservoirs in accordance with one embodiment of the present invention. FIGS. 2A and 2B depict illustrative exemplary representations of the states of magnetization of the free magnetic layer of the MTJ of the MRAM cell 100. FIG. 1 and FIGS. 2A–2B further comprise graphical illustrations of the coordinate system used to describe the embodiments of the invention. To best understand the invention, the reader should simultaneously refer to FIG. 1 and FIGS. 2A–2B. The images in FIGS. 2A–2B are not depicted to scale and are simplified for illustrative purposes.

The MRAM cell 100 is formed on a substrate 101 (e.g., silicon (Si) wafer, and the like) and generally comprises a top electrode 112 (shown using broken lines), a magnetic tunnel junction (MTJ) 103, a bottom electrode 104, and a barrier layer 102.

The top and bottom electrodes 112 and 104 are film electrodes formed of a non-magnetic electrically conductive material, such tantalum (Ta), tantalum nitride (TaN), copper (Cu), and the like. The top electrode 112 is electrically coupled to one programming line (e.g., either a global or local bit line or a global or local word line), while the bottom electrode 104 is electrically coupled to the other programming line of a MRAM device.

The bit and word lines of the MRAM device are generally bi-directional lines which form a cross-point array having a plurality of the MRAM cells 100. In the cross-point array, the MRAM cell 100 is sandwiched between intersecting bit and word lines.

In one embodiment, the top electrode 112 is coupled to a local bit line that is connected to the respective global bit line using a transistor switch and may conduct a write current in the directions illustrated using arrow 126, and the bottom electrode 104 is coupled to the global word line of the MRAM device.

The barrier layer 102 is generally a layer of a non-magnetic dielectric material (e.g., silicon dioxide ($SiO_2$), silicon nitride ($Si_3N_4$), and the like) that is used as an insulator layer between the bottom electrode 104 and substrate 101.

The MTJ 103 is a device which operation is based on the quantum mechanical phenomenon of spin-polarized electron tunneling. The MTJ 103 generally comprises a first magnetic layer 110, a non-magnetic tunnel layer 108, a second magnetic layer 106, and frustrated (i.e., magnetized) magnetic reservoirs 114.

The first magnetic layer 110 is used to store an information content of the MRAM cell 100. The first magnetic layer 110 is known as a "free magnetic layer" and may be formed of nickel-iron (NiFe) alloy, cobalt-iron (CoFe) alloy, or other soft magnetic material. The information content is stored in the first magnetic layer 110 in the form of a direction of magnetization of the magnetic material of the layer.

The second magnetic layer 106 has a higher coercivity than the free magnetic layer 110 and is known as a "reference magnetic layer". The reference magnetic layer 106 generally comprises one or more films of a hard magnetic material, such as ruthenium (Ru), nickel-iron-chrome (NiFeCr) alloy, platinum-manganese alloy (PtMn), or iridium-manganese alloy (IrMn), and may optionally comprise films of NiFe, CoFe, or other soft magnetic materials. In operation, the reference magnetic layer 106 is permanently magnetized in the plane of the layer (i.e., plane XY) in the direction of the Y-axis, either in a positive or negative direction.

The non-magnetic tunnel layer 108 is generally a layer of a dielectric material, such as aluminum oxide ($Al_2O_3$), and the like. The tunneling layer 108 is thin enough that, in operation, quantum mechanical tunneling of electrons (i.e., electrical current) may occur between the free magnetic layer 110 and the reference magnetic layer 106.

The layers of the MRAM cell 100 can be provided using any conventional thin film deposition technique, such as sputtering, chemical vapor deposition, and the like.

An electrical resistance of the MTJ, as measured between the top electrode 112 and bottom electrode 104, depends on whether the free magnetic layer 110 and reference magnetic layer 106 are magnetized in the same (low resistance) or opposing (high resistance) directions.

The magnetic reservoirs 114 are disposed on the free magnetic layer 110 of the MTJ 103 along opposing edges of the layer 110. The magnetic reservoirs 114 may be formed from either a soft magnetic material (e.g., NiFe, CoFe, and the like) or a hard magnetic material.

The magnetic reservoirs 114 are permanently magnetized in the same direction that is substantially orthogonal to the free magnetic layer 110. For example, in the depicted embodiment where the free magnetic layer 110 is disposed in the plane XY, the magnetic reservoirs 114 are magnetized in the plane XZ in the direction of the Z-axis, either in a positive or negative direction. In an alternate embodiment, the magnetic reservoirs 114 may be magnetized using currents running through dedicated conductive lines (not shown) of the MRAM device. The magnetic reservoirs 114 of a plurality of the MRAM cells of a MRAM device may be simultaneously magnetized, for example, by exposing the substrate 101 to a magnet, an electromagnet, or other source of a strong external static magnetic field having the magnetic vector oriented along the Z-axis.

A form factor of the magnetic reservoir 114 is selected in a manner facilitating preferred magnetization of the material of the magnetic reservoir in the direction that is substantially orthogonal to the free magnetic layer 110. More specifically, the magnetic reservoir 114 is generally formed as an elongated structure (e.g., wall, column, or the like) having the largest width (i.e., height) 136 in the direction of the Z-axis and the smallest width 134 in the direction of the Y-axis. The axis of easy (i.e., preferred) magnetization of the material of such a structure coincides with the Z-axis. A length 132 of the magnetic reservoir 114 is smaller than the height 136 and is generally of about the same value as a width 212 of the free magnetic layer 110. When magnetized using the external magnetic field that is applied along the Z-axis, the magnetic reservoir 114 is magnetized in the plane XZ in the direction of the Z-axis.

Such an embodiment of the magnetic reservoir 114 facilitates a long term preservation (in practical terms, preservation for an infinite time) of the state and direction of magnetization of the reservoirs 114 at high temperatures and in the presence of strong stray magnetic fields, as well as in a broad range of environmental factors, such as mechanical shock, vibration, and the like.

To provide efficient magnetic coupling to the free magnetic layer 110, the magnetic reservoir 114 is formed such that the boundary between the magnetic reservoir and the free magnetic layer 110 comprises a minimal number of surface defects and is an electrically conductive boundary. In one embodiment, the magnetic reservoirs 114 and the free magnetic layer 110 may be formed from the same soft magnetic material. In a further embodiment, the magnetic reservoir 114 and free magnetic layer 110 may form a thin film structure having no internal boundaries. As such, the magnetic reservoir 114 is generally electrically coupled to the bit line or the word line of the MRAM device.

The magnetic reservoirs 114 cause magnetization of the magnetic material of the free magnetic layer 110 in regions 105 and 107 that are adjacent to the magnetic reservoirs. The regions 105 and 107 are magnetized in the plane XY in the opposing directions illustrated using arrows 124 and 122, respectively. Further, a boundary 118 forms in a central portion 116 between the magnetized regions 105 and 107 of the free magnetic layer 110.

In FIGS. 1 and 2A–2B, the directions of magnetization in the regions 105 and 107 are arbitrarily shown as pointing towards the bottom portions of the magnetic reservoirs 114. Such magnetization of the regions 105 and 107 corresponds to the magnetization of the magnetic reservoirs 114 in the positive direction of the Z-axis (illustrated using the arrow 120).

In an alternate embodiment, the magnetic reservoirs 114 may be magnetized in the negative direction of the Z-axis. In this case, the regions 105 and 107 become magnetized in the directions that are reversed by 180° from the directions shown by arrows 124 and 122. Specifically, the regions 105, 107 become magnetized away from the bottom portions of the magnetic reservoirs 114 (i.e., towards the central portion 116 of the free magnetic layer 110). However, that has no effect on formation of the boundary 118 and operation of the MJT 103 or MRAM cell 100.

The boundary 118 is a magnetically moveable boundary which position may be changed by a current (e.g., write current) propagating along a bit (or word) line that is disposed between the magnetic reservoirs 114. The write current may propagate either in a positive or negative direction of the X-axis causing the boundary 118 to move towards one of the magnetic reservoirs 114. In general terms, such movements of the boundary 118 within the free magnetic layer 110 that are caused by the write current may be characterized as a high-velocity viscous drag of a state of magnetization in the soft magnetic material of the layer 110.

In the depicted embodiment, when the write current propagates in the positive direction of the X-axis (illustrated in FIG. 2A using an arrow 126A), such a current causes a movement of the boundary 118 into the region 107 and magnetization of the central region 166 in the direction illustrated by arrow 202. Correspondingly, the write current propagating in the negative direction of the X-axis (illustrated in FIG. 2B by the arrow 126B) causes movement of the boundary 118 into the region 105 and magnetization of the central region 166 in the opposite direction, as illustrated using an arrow 204. The frustrated magnetic reservoirs 114, performing as permanent magnets, preserve a given state of magnetization in the free magnetic layer 110 and, as such, the memory state of the MTJ 103 and MRAM cell 100, in a broad range of temperatures, stray magnetic fields, during mechanical shocks, vibration, and the like.

As such, the MRAM cell 100 may use only one current (i.e., write current) to store the information content (i.e., "0" or "1") as a direction of magnetization of the central portion 116 of the free magnetic layer 110. Specifically, the MRAM cell 100 may be controlled using a technique known as the "silicon select" technique, where each MRAM cell of the MRAM device is coupled to a switching transistor that turns on and off the write current for a given cell.

Reading of the information content that has been stored in the MRAM cell 100 may be performed using a conventional method of measuring electrical resistance of the MTJ 103 of the MRAM cell by conducting a current (i.e., read current) through the MTJ 101. Such electrical resistance is typically measured using a current source and a sensing circuit that are coupled to the bit and word lines associated with the given MRAM cell 100 of an array of such cells of the MRAM device.

In one embodiment, the central portion 116 of the free magnetic layer 110 has a smaller width 210 than the other regions of the layer 110 to increase the magnetic flux and stability of a direction of magnetization in the portion 116. In the depicted embodiment, the free magnetic layer 110 has two symmetrically formed trapezoidal recesses 208. In alternate embodiments, the recesses 208 may have a different form factor (e.g., rectangular recesses, and the like), as well as be asymmetrically disposed along the sides of the free magnetic layer 110. In yet another embodiment (not shown), the free magnetic layer 110 may comprise only one recess 208.

Generally, the bit (or word) line used to write the information content in the MRAM cell 100 is disposed over the central region 116. A width of such a line may be selected in a range from a width 138 (i.e., distance between the magnetic reservoirs 114) to a portion of a length 206 of the recess 208. In one embodiment, such a line is disposed over the central region 116 and has a width that is approximately equal to the width 138 to maximize the line current. During reading the information content of the MRAM cell 100, a difference (or ratio) in resistance of the MTJ 103 has a maximal value in the respective arbitrarily designated states "0" and "1" of magnetization of the free magnetic layer 110.

Generally, the write current and time of switching of the MRAM cell 100 from one state of magnetization to another are inversely proportional to the width 212 of the free magnetic layer 110 and the width 210 of the central region 116. Correspondingly, the operational temperature range and thermal stability of the MRAM cell 100 increase when a ratio of the width 212 to the width 210 or the width 206 increases.

In one illustrative embodiment, the MRAM cell 100 comprises the magnetic reservoirs 114 formed as walls having the width 134 of 12.5 nm, height 136 of 60 nm, and length 132 of 40 nm. Such magnetic reservoirs 114 may be formed from permalloy (i.e., nickel-iron (NiFe) alloy) and disposed along the opposing edges of the free magnetic layer 110. The free magnetic layer 110 may be formed of permalloy to the width 212 of 40 nm, length 212 of 100 nm, and a thickness of 3.5 nm. The free magnetic layer 110 comprises the central region 116 having the length 206 of about 31 nm and recesses 208 of about 10 nm. The magnetic reservoirs 114 are magnetized orthogonally to the free magnetic layer 110 using a static magnetic field of about 1 Tesla. In this embodiment of the MRAM cell 100, the write current and time of switching between the states of magnetization of the MRAM cell (i.e., states 202 and 204 of the free magnetic layer 110) is about 0.5 mA and 1 nsec. For comparison, same MRAM cell without the magnetic reservoirs 114 may have a write current of about 20 mA and the switching time of about 0.5 nsec.

The invention may be practiced using other MRAM devices wherein parameters may be adjusted to achieve acceptable characteristics by those skilled in the arts by utilizing the teachings disclosed herein without departing from the spirit of the invention.

Although the forgoing discussion referred to fabrication of the MRAM cell, fabrication of the other devices and structures used in the integrated circuits can benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A magnetoresistive random access memory (MRAM) cell, comprising:
   a magnetic tunnel junction having a first magnetic layer and a second magnetic layer separated by a non-magnetic layer that are formed on a substrate; and
   one or more frustrated magnetic reservoirs disposed oppositely along two edges of the first magnetic layer, said reservoirs magnetized in the same direction and substantially orthogonally to the first magnetic layer.

2. The MRAM cell of claim 1 wherein the first magnetic layer is a free magnetic layer of the magnetic tunnel junction.

3. The MRAM cell of claim 1 wherein said reservoir magnetizes a portion of the free magnetic layer in proximity to the reservoir.

4. The MRAM cell of claim 1 wherein said reservoir has a form factor that preserves a direction of the magnetization of the reservoir.

5. The MRAM cell of claim 1 wherein said reservoir is elongated in the direction of the magnetization.

6. The MRAM cell of claim 1 wherein a smallest width of said reservoir is disposed along a smaller width of the first magnetic layer.

7. The MRAM cell of claim 1 wherein a portion of the first magnetic layer disposed between said reservoirs comprises a region having a width that is smaller than any other width of first magnetic layer between the reservoirs.

8. The MRAM cell of claim 7 wherein the region having the smallest width is disposed substantially centrally between said reservoirs.

9. The MRAM cell of claim 7 wherein the region having the smallest width is elongated towards said reservoirs.

10. The MRAM cell of claim 1 wherein said reservoir is a portion of the first magnetic layer.

11. The MRAM cell of claim 1 wherein said reservoir is electrically coupled to the first magnetic layer.

12. The MRAM cell of claim 1 wherein said reservoir is formed of a soft magnetic material.

13. The MRAM cell of claim 1 wherein said reservoir is formed of a hard magnetic material.

14. The MRAM cell of claim 1 wherein said reservoir is formed of a material selected from a group consisting of NiFe and CoFe.

15. The MRAM cell of claim 1 wherein the magnetic tunnel junction is sandwiched at a cross-point of a bit line and a word line of the MRAM device comprising at least one said cell.

16. The MRAM cell of claim 15 wherein said reservoir is electrically coupled to the bit line or the word line of the MRAM device.

17. The MRAM cell of claim 15 wherein the bit line or the word line of the MRAM device is disposed between said reservoirs.

18. A method of fabricating a magnetoresistive random access memory (MRAM) device, comprising:
    forming a cross-point array of MRAM cells disposed at intersections of bit and word lines of the MRAM device, each MRAM cell comprising:
        a magnetic tunnel junction having a first magnetic layer and a second magnetic layer separated by a non-magnetic layer that are formed on a substrate; and
        one or more frustrated magnetic reservoirs disposed oppositely along two edges of the first magnetic layer; and
    magnetizing said reservoirs in the same direction and substantially orthogonally to the first magnetic layer.

19. The method of claim 18 wherein the first magnetic layer is a free magnetic layer of the magnetic tunnel junction.

20. The method of claim 18 wherein said reservoir magnetizes a portion of the free magnetic layer in proximity to the reservoir.

21. The method of claim 18 wherein said reservoir has a form factor that preserves a direction of the magnetization of the reservoir.

22. The method of claim 18 wherein said reservoir is elongated in the direction of the magnetization.

23. The method of claim 18 wherein a smallest width of said reservoir is disposed along a smaller width of the first magnetic layer.

24. The method of claim 18 wherein a portion of the first magnetic layer disposed between said reservoirs comprises a region having a width that is smaller than any other width of first magnetic layer between the reservoirs.

25. The method of claim 24 wherein the region having the smallest width is disposed substantially centrally between said reservoirs.

26. The method of claim 24 wherein the region having the smallest width is elongated towards said reservoirs.

27. The method of claim 18 wherein said reservoir is a portion of the first magnetic layer.

28. The method of claim 18 wherein said reservoir is electrically coupled to the first magnetic layer.

29. The method of claim 18 wherein said reservoir is formed of a soft magnetic material.

30. The method of claim 18 wherein said reservoir is formed of a hard magnetic material.

31. The method of claim 18 wherein said reservoir is formed of a material selected from a group consisting of NiFe and CoFe.

32. The method of claim 18 wherein the magnetic tunnel junction is sandwiched at a cross-point of a bit line and a word line of the MRAM device comprising at least one said cell.

33. The method of claim 32 wherein said reservoir is electrically coupled to the bit line or the word line of the MRAM device.

34. The method of claim 32 wherein the bit line or the word line of the MRAM device is disposed between said reservoirs.

* * * * *